United States Patent
Chen et al.

(10) Patent No.: US 10,527,930 B2
(45) Date of Patent: Jan. 7, 2020

(54) METHOD OF SUB RESOLUTION ASSIST FEATURE

(71) Applicant: Shanghai Huali Microelectronics Corporation, Shanghai (CN)

(72) Inventors: Zhigang Chen, Shanghai (CN); Junhan Liu, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 154 days.

(21) Appl. No.: 15/822,230

(22) Filed: Nov. 27, 2017

(65) Prior Publication Data

US 2019/0107773 A1    Apr. 11, 2019

(30) Foreign Application Priority Data

Oct. 9, 2017    (CN) .......................... 2017 1 0928912

(51) Int. Cl.
*G03F 1/42*    (2012.01)
*G03F 1/76*    (2012.01)
*G03F 1/80*    (2012.01)
*G03F 1/36*    (2012.01)

(52) U.S. Cl.
CPC .................. *G03F 1/42* (2013.01); *G03F 1/36* (2013.01); *G03F 1/76* (2013.01); *G03F 1/80* (2013.01)

(58) Field of Classification Search
CPC ..... G03F 1/36; G03F 1/42; G03F 1/76; G03F 1/80
USPC .................................................. 430/5, 22, 30
See application file for complete search history.

(56) References Cited

U.S. PATENT DOCUMENTS

| | | | |
|---|---|---|---|
| 8,974,987 B2 * | 3/2015 | Nagai | G03F 1/80 430/5 |
| 10,317,790 B2 * | 6/2019 | Pang | G03F 1/36 |
| 2019/0285991 A1 * | 9/2019 | Hsu | G03F 7/70483 |

* cited by examiner

*Primary Examiner* — Christopher G Young
(74) *Attorney, Agent, or Firm* — Tianchen LLC; Yuan R. Li; Yi Fan Yin

(57) ABSTRACT

The present invention discloses a design method of a sub resolution assist feature, which comprises the following steps of: S01: forming a sub resolution assist feature in the mask plate, the upper surface of the sub resolution assist feature is aligned with the upper surface of the mask plate; S02: forming a process pattern on one side, which contains the sub resolution assist feature, of the mask plate, the position of the process pattern is not superposed with the sub resolution assist feature in a vertical direction.

9 Claims, 2 Drawing Sheets

==Prior Art==

==Prior Art==

METHOD OF SUB RESOLUTION ASSIST FEATURE

CROSS-REFERENCE TO RELAYED APPLICATION

This application claims the priority benefit of China application serial no. 201710928912.9, filed Oct. 9, 2017. All disclosure of the China application is incorporated herein by reference.

FIELD OF THE INVENTION

The present invention relates to a semiconductor fabrication field, more particularly to a design method of a sub resolution assist feature.

BACKGROUND OF THE INVENTION

The rapid development of the semiconductor industry mainly benefits from the improvement of the microfabrication technique of the microelectronic technology, while the lithography technique is one of the most critical techniques in the chip fabrication. Since the optical lithography technique continuously innovates, it breaks through the optical exposure limit desired by people, which makes it become a mainstream technology of current exposure.

The lithography system mainly includes four parts of illumination system (light source), mask, projection system and wafer. Diffraction occurs when light enters on mask, the diffracted lights after entering the projection system occur interference and image on the wafer, and after being subjected the development and etching processing, a pattern is transferred into the wafer.

In the actual production, it often confronts the case where it is required only a small part of pattern with mask sparse, and when there is only sparse process pattern on the mask plate, it may cause difference between an isolated imaging and a dense imaging during the lithography. Therefore, the Sub Resolution Assist Feature (SRAF) design is introduced at a process node of 90 nm in lithography. The sub resolution assist feature is added around a part of sparse pattern, however the sub resolution assist feature only acts as the functions of blocking and scattering lights in the exposure process to increase the focusing depth of the lithography pattern and enlarge the process window of the lithography, they can't form pattern on the wafer. Therefore, the existing technique adds sub resolution assist lines less than the minimum resolution of the lithography process on the mask plate.

These sub resolution assist lines include various serifs and scattering bars. The width of the serifs and scattering bars and the distance of them from the main feature pattern are more important, and need to be optimized according to the specific situations, to achieve the profile adjustment on the space image by influencing the phase spectrum with the scattering bars. These scattering bars or serifs, by improving the energy and phase distribution of various frequency components in the pattern spectrum, can effectively adjust the light intensity distribution of the space image without forming pattern on the etching resist, and can act as the functions of improving the linewidth deviation, strengthening the corner profile and increasing focusing depth of exposure.

The conventional design method of the SRAF is shown in FIG. 1, and specifically comprises the following steps of:

(1) depositing a metal layer on a surface of a mask plate;

(2) defining a sub resolution assist feature and a process pattern on the metal layer, and performing exposure;

(3) etching a portion other than the sub resolution assist feature and process pattern on the metal layer, to form the sub resolution assist feature and the process pattern which are located on the same horizontal plane.

In the procedure that the mask plate fabricated according to the above process is used as a mask, since the sub resolution assist feature and the process pattern are located on the same horizontal plane, the focusing planes of the sub resolution assist feature and the process pattern are also located on the same horizontal plane correspondingly, as shown in FIG. 2. This results in that the sub resolution assist feature may cause a ghost defect on the silicon wafer during the exposure, thereby influence the exposure quality of the silicon wafer.

In addition, the size of the sub resolution assist feature can't be too small either, and if the feature is too small, it can't effectively block the incident light, and may even deteriorate the process window of the lithography pattern. While in the procedure of the above process fabrication, if sub resolution assist feature is made become small, this will increase the cost of the mask lithography, thereby increase the fabrication cost of the mask plate. Therefore, in the procedure of the sub resolution assist feature design, the size of the sub resolution assist feature shall be appropriately controlled.

SUMMARY OF THE INVENTION

The technical problem to be solved by the present invention is to provide a design method of a sub resolution assist feature, in which the sub resolution assist feature is set in a mask plate and a process pattern is set on the mask plate, so as to avoid the sub resolution assist feature and the process pattern being located on the same focusing plane, reduce a risk of occurring the ghost, control the size of sub resolution assist feature better, and enhance the scattering effect.

To achieve the above objects, the present invention adopts the following technical solution: a design method of a sub resolution assist feature, comprising the following steps of:

S01: forming a sub resolution assist feature in the mask plate, the upper surface of the sub resolution assist feature is aligned with the upper surface of the mask plate;

S02: forming a process pattern on one side, which contains the sub resolution assist feature, of the mask plate, the position of the process pattern is not superposed with the sub resolution assist feature in a vertical direction.

Further, the sub resolution assist feature is added around a sparse part of the process pattern.

Further, the thickness of the sub resolution assist feature is less than or equal to the thickness of the mask plate.

Further, the step S01 is specifically as follows:

S0101: defining a desired pattern of the sub resolution assist feature on the surface of the mask plate, and performing an exposure to form the desired pattern;

S0102: transferring the desired pattern into the mask plate after being etching processing;

S0103: growing a metal layer in the desired pattern to form the sub resolution assist feature.

Further, in the step S0102, the desired pattern after the exposure is etched by using a dry etching.

Further, in the step S0103, after growing the metal layer in the desired pattern, the upper surface of the sub resolution assist feature is made to be aligned with the surface of the mask plate by an etch-back manner.

Further, the metal layer is chromium.

Further, the step S02 is specifically as follows:

S0201: growing a metal layer on the surface of one side, which contains the sub resolution assist feature, of the mask plate;

S0202: defining the process pattern on the metal layer, and performing exposure;

S0203: etching the metal layer other than the process pattern to form the process pattern.

Further, the material of the metal layer is chromium.

The mask for lithography provided in the present invention includes a mask plate, a sub resolution assist feature and a process pattern, wherein the sub resolution assist feature is located in the mask plate, the upper surface of the sub resolution assist feature is aligned with the surface of the mask plate, and the process pattern is located on the surface of one side, which contains the sub resolution assist feature, of the mask plate, and wherein the position of the process pattern is not superposed with the sub resolution assist feature in the vertical direction, and when the mask plate for lithography is used as a mask, the incident light enters from the back of the process pattern and the sub resolution assist feature, and performs exposure on the wafer after respectively passing through the sub resolution assist feature and the process pattern.

Further, the sub resolution assist feature and the process pattern are not on the same focusing plane.

The beneficial effects of the present invention are as follows: the present invention, by setting the sub resolution assist feature and the process pattern on two different planes, wherein the sub resolution assist feature is located in the mask plate and the process pattern is located on the surface of one side containing the process assist feature of the mask plate, avoids the sub resolution assist feature and the process pattern being located on the same focusing plane, so as to achieve the effect of reducing the occurrence of ghost. In addition, the sub resolution assist feature and the process pattern are individually fabricated, which can control the size of the process assist feature better, and enhance the scattering effect.

BRIEF DESCRIPTION OF THE DRAWINGS

The optimization method and system for overlay error compensation of the present invention will be elucidated by reference to the following embodiments and the accompanying drawings, in which.

REFERENCE SIGNS 1 mask plate
2 sub resolution assist feature
3 process pattern
4 silicon wafer

DETAILED DESCRIPTION OF THE EMBODIMENTS

To make the object, the technical solution and the advantage of the present invention clearer, the specific embodiments of the present invention are described in detail below in combination with drawings.

Figure 1:
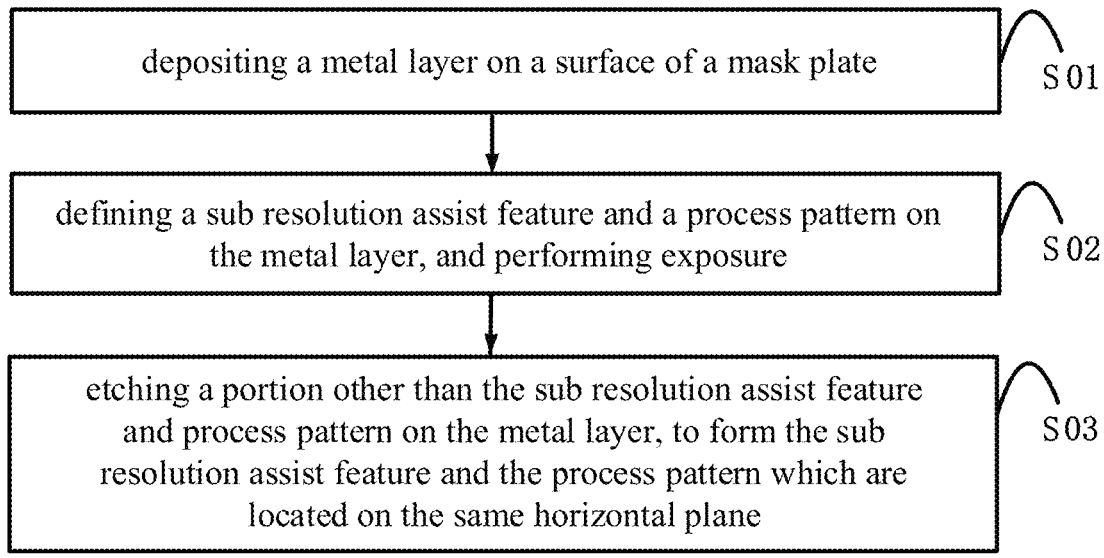
FIG. 1 is a flow chart of fabricating a sub resolution assist feature and a process pattern in the prior art.
Figure 2:
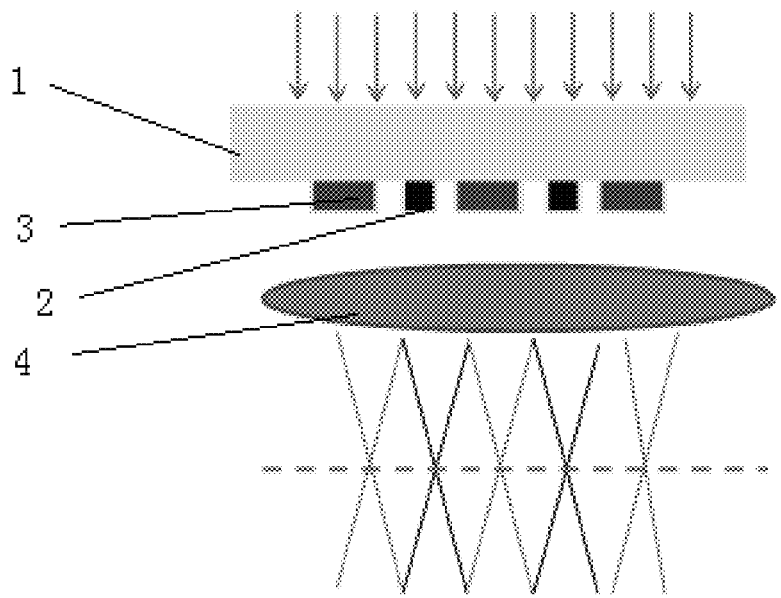
FIG. 2 is a schematic diagram in which the sub resolution assist feature and the process pattern have the same focusing plane in the prior art.
Figure 3:
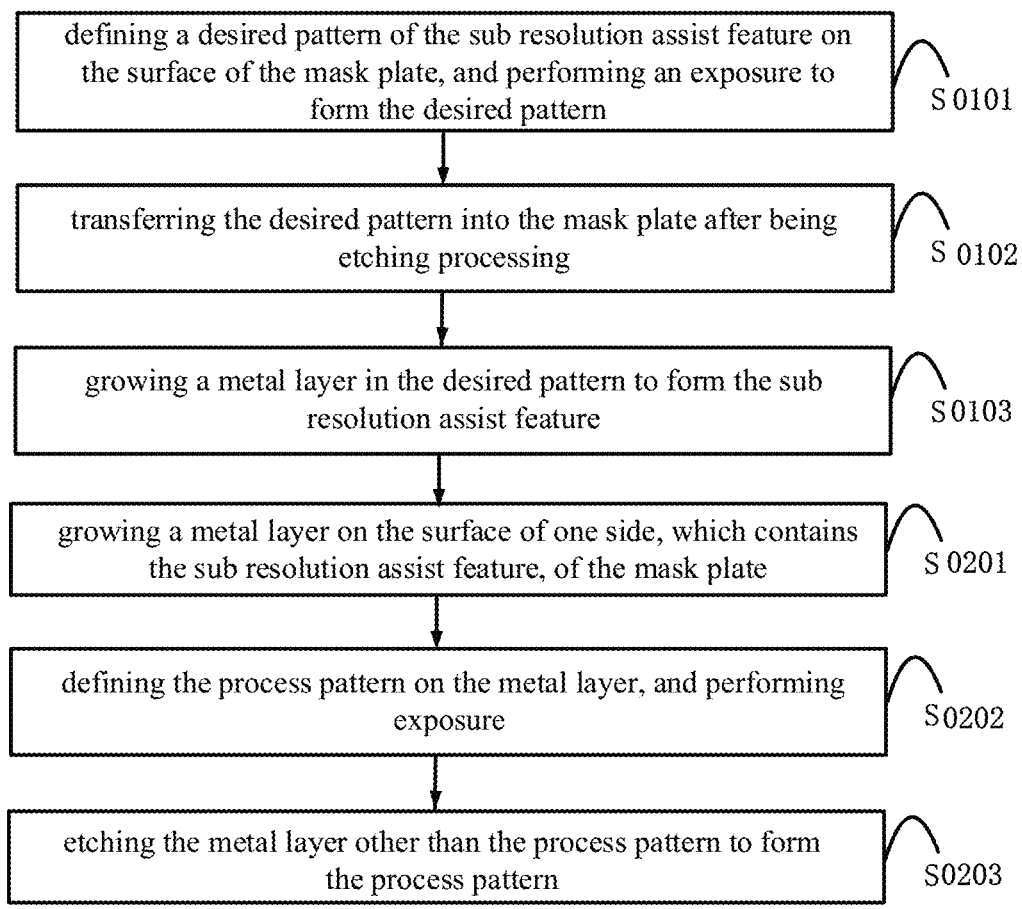
FIG. 3 is a flow chart of a design method of a sub resolution assist feature of the present invention.

As shown in FIG. 3, the present invention provides a design method of a sub resolution assist feature, comprising the following steps of:

S01: forming a sub resolution assist feature in the mask plate, the upper surface of the sub resolution assist feature is aligned with the upper surface of the mask plate.

Wherein the thickness of the sub resolution assist feature is less than the thickness of the mask plate, that is to say, in the present invention, the sub resolution assist feature is formed in grooves inside the mask plate, and the upper surface of the grooves are parallel with the upper surface of the mask plate.

Wherein, the S01 is specifically as follows:

S0101: defining a desired pattern of the sub resolution assist feature on the surface of the mask plate, and performing an exposure to form the desired pattern.

The patterned manner of the mask in the prior art can be adopted to define the position of the sub resolution assist feature on the surface of the mask plate, that is, a portion other than the sub resolution assist feature may be covered by using photoresist, and an exposure is performed.

When the position and size of the sub resolution assist feature are defined, it is required to consider the factors such as application environment of the mask plate, the kinds of incident lights, the position and density degree of the process pattern and so on.

In addition, the size of the sub resolution assist feature can't be too small, and if too small, it will result in that the sub resolution assist feature can't attain an effect of blocking the incident light, and the process window of the sub resolution assist feature may even deteriorate.

S0102: transferring the desired pattern into the mask plate after being etching processing. This can be performed by any method for etching the mask plate in the prior art, and in the present embodiment, the dry etching is used to form the groove. The gas selected in the dry etching is gas for etching the mask plate in the prior art.

S0103: growing a metal layer in the desired pattern to form the sub resolution assist feature. Wherein the metal layer can be chromium.

And after the metal layer is grown in the groove of the desired pattern, the metal grown in the groove will exceed the surface of the mask plate. At this point, the unnecessary metal which is higher than the plane of the mask plate in the groove is removed by an etch-back manner, so that the upper surface of the sub resolution assist feature is aligned with the surface of the mask plate.

S02: forming a process pattern on one side, which contains the sub resolution assist feature, of the mask plate, the position of the process pattern is not superposed with the sub resolution assist feature in a vertical direction.

The step S02 is specifically as follows:

S0201: growing a metal layer on the surface of one side, which contains the sub resolution assist feature, of the mask plate.

In this step, the upper surface of the sub resolution assist feature is aligned with the upper surface of the mask layer. That is, the upper surface of the mask plate containing the sub resolution assist feature is planar, and the metal layer is grown directly on the surface of one side, which contains the sub resolution assist feature, of the mask plate. The metal layer may be any metal capable of being used as the process pattern, and the metal chromium is selected in the present embodiment.

S0202: defining the process pattern on the metal layer, and performing exposure.

In the present invention, the patterned process in the prior art may be adopted to define the position of the process pattern on the metal layer. In the present embodiment, a photoresist is used to cover the position of the process pattern, and an exposure is performed, to determine the position of the process pattern on the metal layer.

S0203: etching the metal layer other than the process pattern to form the process pattern.

The metal layer other than the process pattern is etched by using the photoresist as mask and the etching is stopped at the surface of the mask plate. Thus, a new mask plate containing a mask plate, a sub resolution assist feature and a process pattern is formed. Moreover, the sub resolution assist feature and the process pattern are located on different planes of the mask plate, thereby avoid the sub resolution assist feature and the process pattern being located on the same focusing plane, and reduce the risk of occurring ghost.

The mask plate for lithography provided in the present invention includes a mask plate, a sub resolution assist feature and a process pattern, wherein the sub resolution assist feature is located in the mask plate, the upper surface of the sub resolution assist feature is aligned with the surface of the mask plate, and the thickness of the sub resolution assist feature is less than or equal to the thickness of the mask plate. The process pattern is located on the surface of one side, which contains the sub resolution assist feature, of the mask plate, and wherein the position of the process pattern is not superposed with the sub resolution assist feature in the vertical direction, that is, the sub resolution assist feature and the process pattern are alternated each other in the vertical direction. When the mask plate for lithography is used as a mask, the incident light enters from the back of the process pattern and the sub resolution assist feature, and performs exposure on the wafer after respectively passing through the sub resolution assist feature and the process pattern.

Figure 4:
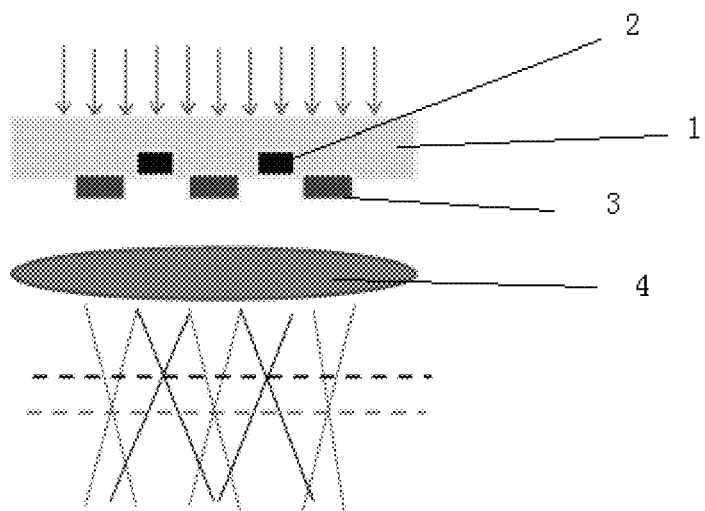
FIG. 4 is a schematic diagram in which the sub resolution assist feature and the process pattern have different focusing planes in the present invention.

From the above, the present invention provides a mask plate 1 for lithography, wherein the sub resolution assist feature 2 is located in the mask plate 1, and the process pattern 3 is located on the surface of one side, which contains the sub resolution assist feature 2, in the mask plate 1. This avoids the sub resolution assist feature 2 and the process pattern 3 being located on the same focusing plane when performing a mask lithography on the silicon wafer 4, to achieve the effects of reducing the occurrence of ghost, as shown in FIG. 4.

In addition, the sub resolution assist feature 2 and the process pattern 3 are individually fabricated, which can control the size of the process assist feature 2 better, and enhance the scattering effect.

The above is only the preferred embodiment of the present invention. The embodiment is not intended to limit the patent protection scope of the present invention. Therefore, all the equivalent structural changes made using the contents of the specification and drawings of the present invention, should be encompassed in the protection scope of the present invention in a similar way.

The invention claimed is:

1. A design method of a sub resolution assist feature, wherein comprising the following steps of:
    S01: forming a sub resolution assist feature in the mask plate, the upper surface of the sub resolution assist feature is aligned with the upper surface of the mask plate;
    S02: forming a process pattern on one side, which contains the sub resolution assist feature, of the mask plate, the position of the process pattern is not superposed with the sub resolution assist feature in a vertical direction.

2. The design method of the sub resolution assist feature according to claim 1, wherein the thickness of the sub resolution assist feature is less than or equal to the thickness of the mask plate.

3. The design method of the sub resolution assist feature according to claim 1, wherein the step S01 is specifically as follows:
    S0101: defining a desired pattern of the sub resolution assist feature on the surface of the mask plate, and performing an exposure to form the desired pattern;
    S0102: transferring the desired pattern into the mask plate after being etching processing;
    S0103: growing a metal layer in the desired pattern to form the sub resolution assist feature.

4. The design method of the sub resolution assist feature according to claim 3, wherein in the step S0102, the desired pattern after the exposure is etched by using a dry etching.

5. The design method of the sub resolution assist feature according to claim 3, wherein in the step S0103, after growing the metal layer in the desired pattern, the upper surface of the sub resolution assist feature is made to be aligned with the surface of the mask plate by an etch-back manner.

6. The design method of the sub resolution assist feature according to claim 3, wherein the metal layer is chromium.

7. The design method of the sub resolution assist feature according to claim 1, wherein the step S02 is specifically as follows:
    S0201: growing a metal layer on the surface of one side, which contains the sub resolution assist feature, of the mask plate;
    S0202: defining the process pattern on the metal layer, and performing exposure;
    S0203: etching the metal layer other than the process pattern to form the process pattern.

8. The design method of the sub resolution assist feature according to claim 7, wherein the material of the metal layer is chromium.

9. The design method of the sub resolution assist feature according to claim 1, wherein the sub resolution assist feature is added around a sparse part of the process pattern.

* * * * *